(12) United States Patent
Spencer et al.

(10) Patent No.: US 6,903,004 B1
(45) Date of Patent: Jun. 7, 2005

(54) METHOD OF MAKING A SEMICONDUCTOR DEVICE HAVING A LOW K DIELECTRIC

(75) Inventors: Gregory S. Spencer, Pflugerville, TX (US); Michael D. Turner, San Antonio, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/736,853

(22) Filed: Dec. 16, 2003

(51) Int. Cl.[7] .......................................... H01L 21/4763
(52) U.S. Cl. ...................... 438/624; 438/623; 438/622; 438/625; 438/626; 438/627; 438/628; 438/629
(58) Field of Search ................................. 438/622–629

(56) References Cited

U.S. PATENT DOCUMENTS

| | | | |
|---|---|---|---|
| 6,153,512 A | 11/2000 | Chang | |
| 6,197,704 B1 | 3/2001 | Endo | |
| 6,303,525 B1 | 10/2001 | Annapragada | |
| 6,331,480 B1 | 12/2001 | Tsai | |
| 6,348,407 B1 | 2/2002 | Gupta | |
| 6,383,913 B1 | 5/2002 | Tsai | |
| 6,440,878 B1 | 8/2002 | Yang | |
| 6,455,443 B1 | 9/2002 | Eckert | |
| 6,465,372 B1 | 10/2002 | Xia | |
| 6,472,335 B1 | 10/2002 | Tsai | |
| 6,486,061 B1 | 11/2002 | Xia | |
| 6,603,204 B2 * | 8/2003 | Gates et al. | 257/760 |
| 6,716,742 B2 * | 4/2004 | Gates et al. | 438/623 |
| 2003/0129827 A1 * | 7/2003 | Lee et al. | 438/629 |
| 2004/0101633 A1 * | 5/2004 | Zheng et al. | 427/551 |

* cited by examiner

*Primary Examiner*—Luan Thai
(74) *Attorney, Agent, or Firm*—James L. Clingan, Jr.; David G. Dolezal

(57) ABSTRACT

A low K dielectric layer and a cap for the low K dielectric layer are formed in situ using the same silicon precursors but at different precursor ratios. The low K dielectric is deposited with precursors that are useful for making a low K dielectric. Trenches are formed in the low K dielectric and are filled by a metal layer. Chemical mechanical processing (CMP) is utilized to remove the metal outside the trench while the cap aids planarity outside the trench.

22 Claims, 3 Drawing Sheets

METHOD OF MAKING A SEMICONDUCTOR DEVICE HAVING A LOW K DIELECTRIC

RELATED APPLICATION

This invention is related to a U.S. Patent Application having Ser. No. 10/659,885, filed Sep. 11, 2003, entitled, "Integration of Ultra Low K Dielectric in a Semiconductor Fabrication Process," and assigned to the assignee hereof.

FIELD OF THE INVENTION

The present invention is in the field of semiconductor devices and more particularly in the field of semiconductor fabrication processes employing low K dielectrics.

RELATED ART

In the field of semiconductor fabrication, the use of dielectric materials having a low dielectric constant (low K materials) is well known. Low K dielectrics are used primarily in backend processing. Backend processing refers generally to processing subsequent to the formation of transistors in the wafer substrate to connect the transistors (typically with multiple levels of interconnects). Each interconnect level is separated by an interlevel dielectric (ILD). The individual interconnects within a single interconnect level are also separated by a dielectric material that may or may not be the same as the ILD. Vias or contacts are formed in the ILD's and filled with conductive material to connect the interconnect levels in a desired pattern to achieve a desired functionality.

The spacing between adjacent interconnects within an interconnect level and the spacing between vertically adjacent levels have both decreased as device complexity and performance have increased. Minimizing cross coupling between the many signals within a device is now a significant design consideration. The primary source of signal cross coupling or cross talk is capacitive. A pair of adjacent interconnect (whether within a single interconnect level or in vertically adjacent interconnect levels) separated by an intermediate dielectric material form an unintended parallel plate capacitor. Minimizing cross coupling requires a minimization of the capacitance between any pair of adjacent interconnects, especially those interconnects that carry signals that switch at high frequency.

One popular approach to minimizing cross talk includes the use of low K dielectric materials as the interconnect dielectric. Low K materials reduce cross talk because the capacitance of a parallel plate capacitor is directly proportional to the dielectric constant of the material between the capacitor plates. A lower dielectric constant material translates into lower capacitance and lower cross coupling.

Various low K materials have been used in low K backend processing with mixed results. Integration of low K material into existing fabrication processes is particularly challenging in the case of backend processing that includes the use of chemical mechanical polishing (CMP). CMP is a technique by which each interconnect level is formed in many existing processes. In a CMP process, as implied by its name, a film or layer is physically polished with a rotating polishing pad in the presence of a "slurry" that contains mechanical abrasion components and/or chemical components to produce a smooth upper surface and to remove excess conductive material and thereby isolate the individual interconnects from one another.

Low K materials are generally not easily integrated into a CMP-based backend process. Low K materials tend to exhibit dishing and erosion and other forms of deterioration under chemical mechanical polishing and are susceptible to slurry penetration into the Low K material. To combat this problem, capping materials have been formed over the low K dielectrics to act as a CMP stop. Unfortunately, adhesion between many materials used as low K materials and other materials suitable for use as a CMP stopping layer is often not good. TEOS, for example, is a good CMP stopping layer, but it doesn't adhere well to typical low K dielectrics. It would be desirable, therefore, to implement a process integrating low K interconnect dielectrics into a CMP backend process flow.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, a low K dielectric layer and a cap for the low K dielectric layer are formed in situ using the same silicon precursors but at different precursor ratios. The low K dielectric is deposited with precursors that are useful for making a low K dielectric. Trenches are formed in the low K dielectric and are filled by a metal layer. Chemical mechanical processing (CMP) is utilized to remove the metal outside the trench while the cap aids planarity outside the trench. This is better understood by reference to the drawings and the following specification.

Figure 1:
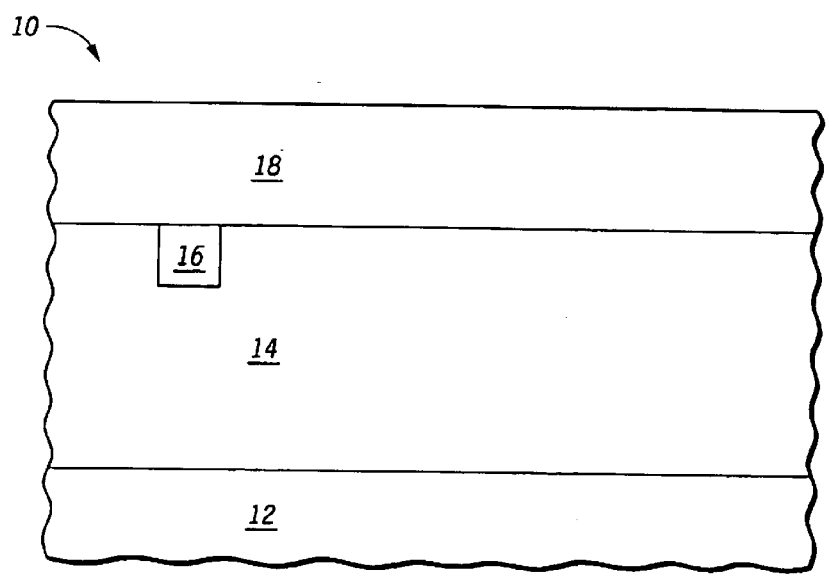
FIG. 1 is a cross section of a semiconductor device at a stage in processing according to an embodiment of the invention.

Shown in FIG. 1 is a semiconductor device 10 comprising a substrate 12, a dielectric 14 over substrate 12, a metal line 16 in dielectric layer 14 at the surface of dielectric layer 14, and dielectric layer 18. Metal line 16 is shown separated from substrate 12 by only dielectric 14 but other structures not shown for ease of understanding may also be present. Similarly dielectric layer 14 may also be a composite of a variety of dielectric layers. Dielectric layer 18 is a carbon-doped silicon oxide that is deposited in a plasma CVD chamber to a thickness of about 5000 Angstroms by introducing octamethylcyclotetrasiloxane (OMCTS), oxygen, ethylene, and helium at a temperature of about 400 degrees Celsius, a pressure of about 7 Torr, and a power of about 900 watts. The flow ratio of OMCTS to oxygen is about 8 milligrams per minute to 1 standard cubic centimeter (SCCM). The flow rate of OMCTS is about 5000 milligrams per minute. The nominal dielectric constant is about 2.6 but should not be greater than about 2.7. A dielectric constant of less than 3.0, which is a desirable achievement for a low k dielectric, is thus obtained. The ratio of the milligrams per minute of the OMCTS to the SCCM of the oxygen should be at least two to one. Also other temperatures, pressures, powers and thicknesses can be effective. For example, temperature can be 250 to 450 degrees Celsius. The pressure can be 4 to 10 Torr. The power can be 500 to 1000 watts. The flow rate of the OMCTS 2000 and 8000 milligrams per minute. The thickness can be between 2000 to 8000 Angstroms. Other parameters than the ranges listed above may also be effective. The helium acts as a carrier gas for the OMCTS and is applied at about 1000 SCCM. This can vary greatly. The ethylene, which has a flow rate of about 2000 SCCM, acts as a reaction buffer to limit the reaction of the OMCTS and the oxygen at the film surface as it is being formed. This flow rate can also vary greatly.

Figure 2:
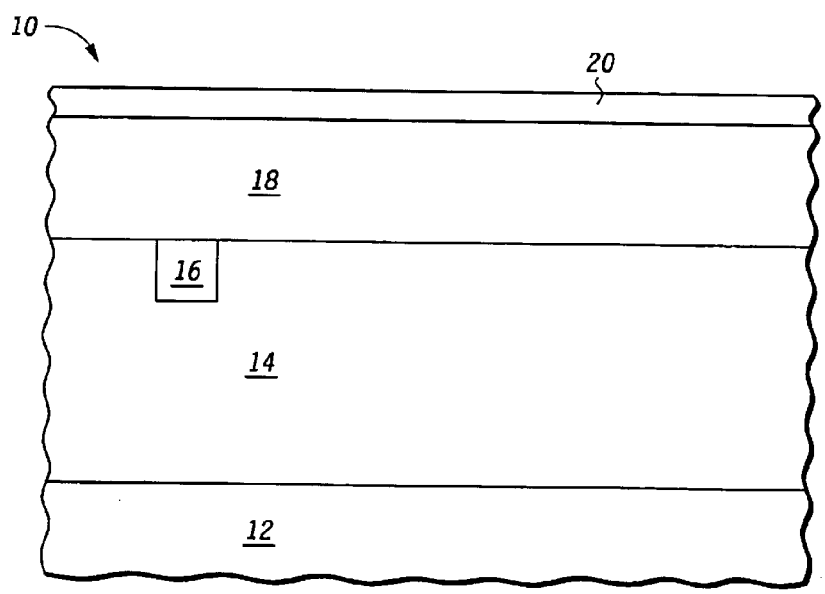
FIG. 2 is a cross section of the semiconductor device of FIG. 1 at a subsequent stage in processing according to the embodiment of the invention.

Shown in FIG. 2 is semiconductor device after deposition of a cap 20 that is formed in situ with low K dielectric layer 18. Cap 20 is deposited by changing the ratio of the milligrams of OMCTS to the SCCM of oxygen to about 1 to 2.5. This should be not greater than about 1 to 1. The pressure is reduced to about 3 Torr. This can vary from 1 to 10. Otherwise, the parameters are left the same. The pressure is preferably reduced to increase ion bombardment on the film, cap 20, as it is being deposited to increase its density. The parameters may also be changed for this. The primary desired effect is achieved from the ratio of the flow rates of OMCTS to oxygen being reduced to form cap 20 with the desired characteristics. Cap 20, formed in this way, has characteristics beneficial for protecting an underlying low K dielectric during the CMP process. The thickness of cap 20 is about 1500 Angstroms so that a total of about 6500 Angstroms for cap 20 and low K dielectric 18. Cap 20 may also be another thickness, for example between 500 to 2000 Angstroms.

Cap 20 so formed is effective as a layer that protects an underlying low K dielectric that is relatively soft and subject to dishing. Cap 20 is significantly harder than underlying low K dielectric layer 18 and has been found to be useful for subsequent protection for dielectric layer 18 under CMP processing. This processing results in a carbon concentration that is quite small but measurably greater than some oxide films. For example the oxygen to carbon ratio is about 3600 to 1, whereas it is about 20,000 to 1 for TEOS oxide. Similarly the ratio of silicon to carbon is about 85 to 1, whereas it is about 350 to 1 for TEOS. The silicon to carbon ratio should be less than about 175 to 1. These intensity ratios are based on measurements using the time of flight secondary ion mass spectroscopy technique.

Figure 3:
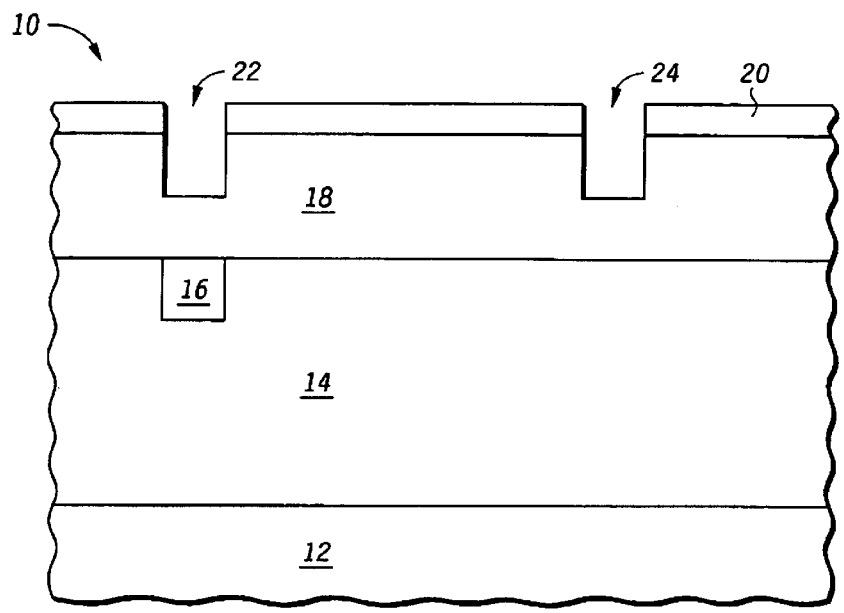
FIG. 3 is a cross section of the semiconductor device of FIG. 2 at a subsequent stage in processing according to the embodiment of the invention.

Shown in FIG. 3 is semiconductor device 10 after forming a trench 22 and a trench 24 in cap 20 and low K dielectric 18. Trench 22 is over metal line 16. Trenches 22 and 24 are about 4500 Angstroms deep. The process for forming trenches is known to one of ordinary skill in the art.

Figure 4:
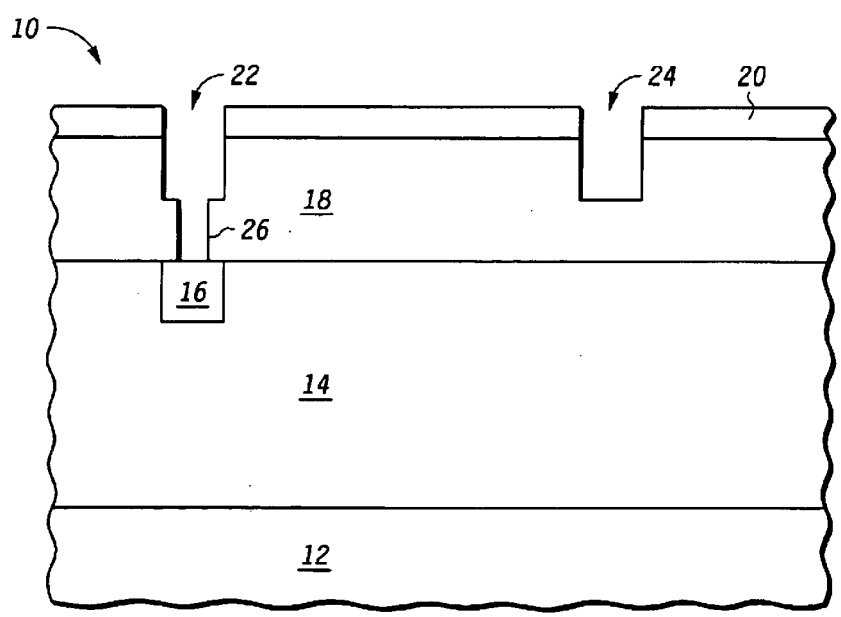
FIG. 4 is a cross section of the semiconductor device of FIG. 3 at a subsequent stage in processing according to the embodiment of the invention.

Shown in FIG. 4 is semiconductor device 10 after formation of a via hole 26 in dielectric 18 between metal line 16 and the bottom of trench 22. Via hole 26 is about 2000 Angstroms deep. The process for forming vias from a trench, whether before or after forming the trench, is known to one of ordinary skill in the art.

Figure 5:
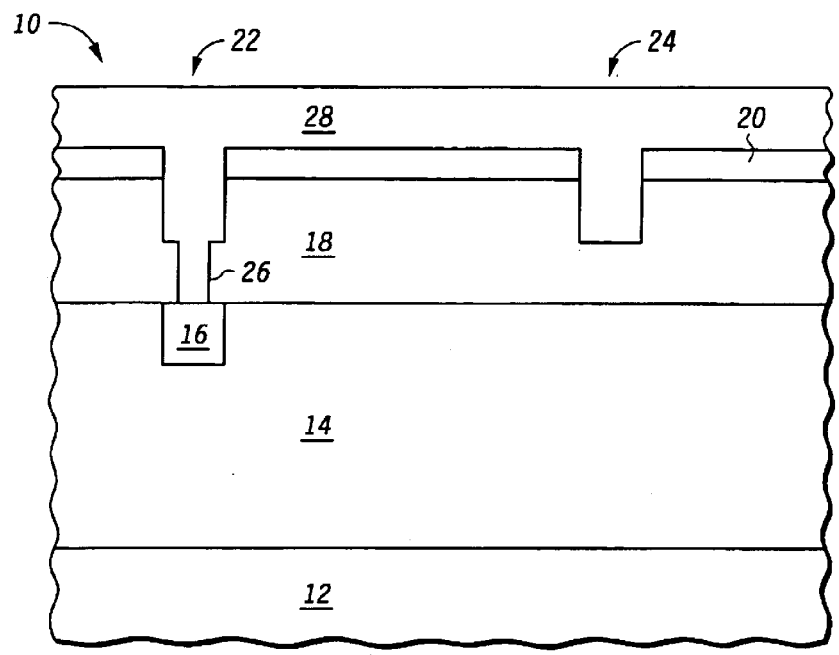
FIG. 5 is a cross section of the semiconductor device of FIG. 4 at a subsequent stage in processing according to the embodiment of the invention.

Shown in FIG. 5 is semiconductor device 10 after deposition of a metal layer 28 that fills via hole 26 and trenches 22 and 24 as well as extending over cap 20. Typical metals used for this purpose include aluminum and copper. In both cases there is generally a barrier layer included as well. In any event, deposition of metal to fill trenches and overlie the surrounding dielectric is known to one of ordinary skill in the art.

Figure 6:
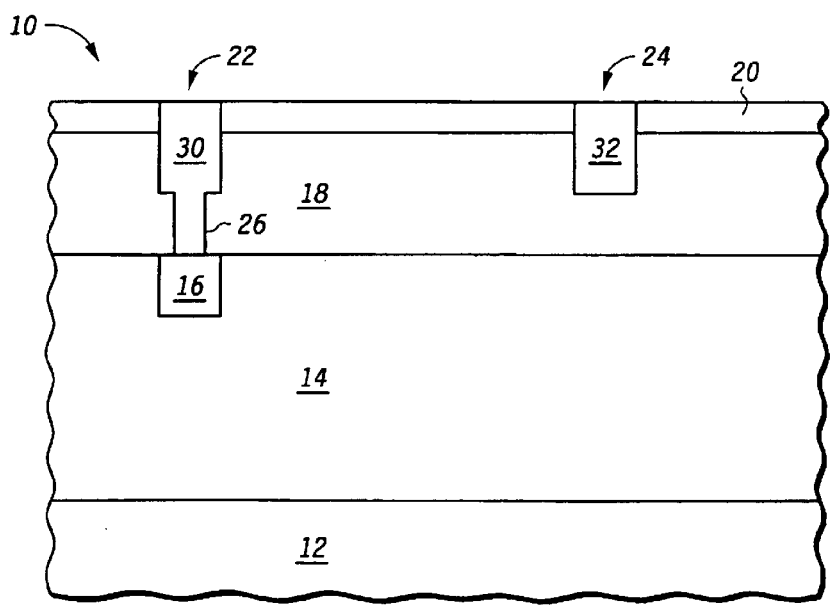
FIG. 6 is a cross section of the semiconductor device of FIG. 5 at a subsequent stage in processing according to the embodiment of the invention.

Shown in FIG. 6 is semiconductor device 10 after a CMP process step which removes metal layer 28 that is on cap 20. The CMP process also removes at least a portion of cap 20. This leaves metal portions 30 and 32 from metal layer 28 in trenches 22 and 24. Metal portion 30 is also in via hole 26 that completes the via to metal line 16. It is beneficial to remove at least a portion of cap 20 because it is a higher K than low K dielectric layer 18. The result is that the surface of the metal in trenches 22 and 24 and the surface of cap 20 are substantially coplanar. Metal line 16, along with metals 30 and 32 form a useful interconnect for semiconductor device 10. Removing metal by CMP to leave a substantially planar surface is known to one of ordinary skill in the art.

In the foregoing specification, the invention has been described with reference to specific embodiments. However, one of ordinary skill in the art appreciates that various modifications and changes can be made without departing from the scope of the present invention as set forth in the claims below. For example, OMCTS has been described as a useful the dominant precursor but another dominant precursor could also be used. For example tetramethylcyclotetrsiloxanes (TMCTS) may be used instead of OMCTS. Also, metal has been described as filling the trenches followed by CMP. There may, however, be situations in which CMP is required on other structures such as a via level, with another fill material, or even no fill material for the case of a trench as a wave guide. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method comprising:
   forming a dielectric overlying a substrate of a wafer, wherein the forming the dielectric further comprises:
      forming a low K dielectric layer overlying the substrate by a chemical vapor deposition (CVD) process using a silicon precursor, wherein a dielectric constant of the low K dielectric layer is less than 3.0;
      forming a second dielectric layer overlying the low K dielectric layer by a CVD process using the silicon precursor;
   forming a void in the dielectric including in the low K dielectric layer and the second dielectric layer;
   depositing a material over the wafer including depositing the material in the void;
   removing portions of the material exterior to the void by polishing the wafer with a chemical mechanical polishing (CMP) process wherein the polishing removes at least some of the second dielectric layer.

2. The method of claim 1 wherein the silicon precursor includes a OctaMethylCycloTetraSiloxane(OMCTS) material.

3. The method of claim 1 wherein the silicon precursor includes a TetraMethylCycloTetraSiloxane(TMCTS) material.

4. The method of claim 1 wherein the silicon precursor includes molecules having a cyclic siloxane structure.

5. The method of claim 1 wherein the forming the low K dielectric layer and the forming the second dielectric layer includes maintaining continuous plasma using the silicon precursor.

6. The method of claim 5 wherein the maintaining the continuous plasma further includes providing plasma using the silicon precursor and oxygen at a first ratio of silicon precursor to oxygen during the forming the low K dielectric layer and providing plasma using the silicon precursor and oxygen at a second ratio of silicon precursor to oxygen during the forming the second dielectric layer, wherein the first ratio is greater than the second ratio.

7. The method of claim 1 wherein:
the forming the low K dielectric layer includes providing plasma using the silicon precursor and oxygen at a first ratio of silicon precursor to oxygen;
wherein the forming the second dielectric layer includes providing plasma using the silicon precursor and oxygen at a second ratio of silicon precursor to oxygen;
wherein the first ratio is greater than the second ratio.

8. The method of claim 7 wherein the first ratio is greater than or equal to 2 milligrams per minute of silicon precursor to 1 standard cubic centimeter of oxygen.

9. The method of claim 7 wherein the second ratio is less than or equal to 1 milligram per minute of silicon precursor to 1 standard cubic centimeter of oxygen.

10. The method of claim 1 wherein the low K dielectric layer has a dielectric constant of less than 2.8.

11. The method of claim 1 wherein the low K dielectric layer has a thickness of 2000 Angstroms or greater.

12. The method of claim 1 wherein the chemical vapor deposition (CVD) process used in forming the low K dielectric layer includes is performed with a deposition in a range of 4–10 Torr.

13. The method of claim 1 wherein no K value degrading processes are performed on the low K dielectric layer prior to the forming the second dielectric layer.

14. The method of claim 1 wherein the material is a conductive material.

15. The method of claim 1 wherein the low K dielectric layer is formed on a surface of the wafer including on conductive material and on another dielectric.

16. The method of claim 1 wherein the second layer has a hardness and the low K dielectric layer has a hardness, wherein the hardness of the second dielectric layer is greater than the hardness of the low K dielectric layer.

17. The method of claim 1 wherein a portion of the second dielectric layer remains after the removing portions of the material exterior to the void.

18. A method of making a dielectric comprising:
forming a low K dielectric layer overlying a wafer substrate by a chemical vapor deposition (CVD) that includes providing plasma using a silicon precursor and oxygen at a first ratio of silicon precursor to oxygen, the silicon precursor including at least one of a OctaMethylCycloTetraSiloxane(OMCTS) material and a TetraMethylCycloTetraSiloxane(TMCTS) material, wherein a dielectric constant of the low K dielectric layer is less than 3.0, and
forming a second dielectric layer on the low K dielectric layer by a CVD process that includes providing plasma using the silicon precursor and oxygen at a second ratio of silicon precursor to oxygen;
wherein the first ratio is greater than the second ratio.

19. The method of claim 18 wherein the first ratio is greater than or equal to 2 milligrams per minute of silicon precursor to 1 standard cubic centimeter of oxygen.

20. The method of claim 18 wherein the second ratio is less than or equal to 1 milligrams per minute of silicon precursor to 1 standard cubic centimeter of oxygen.

21. A semiconductor device comprising:
a substrate;
an interconnect overlying the substrate, the interconnect comprising:
a dielectric overlying the substrate, the dielectric including a low K dielectric layer and a second dielectric layer overlying the low K dielectric layer, the low K dielectric layer having a dielectric constant of less than 3.0, the second dielectric layer having a silicon to carbon intensity ratio of less than about 175 to 1 by time of flight secondary ion mass spectroscopy; and
a conductive interconnect structure located in a void of the dielectric, the void including a void in the low K dielectric layer and a void in the second dielectric layer;
wherein the second dielectric layer and the conductive interconnect structure each have a surface substantially coplanar with each other.

22. A method comprising:
forming a dielectric overlying a substrate of a wafer, wherein the forming the dielectric further comprises:
forming a low K dielectric layer overlying the substrate by a chemical vapor deposition (CVD) that includes providing plasma using a silicon precursor and oxygen at a first ratio of silicon precursor to oxygen, the silicon precursor including at least one of a OctaMethylCycloTetraSiloxane(OMCTS) material and a TetraMethylCycloTetraSiloxane(TMCTS) material;
forming a second dielectric layer overlying the low K dielectric layer by a CVD process that includes providing plasma using the silicon precursor and oxygen at a second ratio of silicon precursor to oxygen;
wherein the first ratio is greater than the second ratio;
forming a void in the dielectric including in the low K dielectric layer and the second dielectric layer;
depositing a material over the wafer including depositing the material in the void; and
removing portions of the material exterior to the void by polishing the wafer with a chemical mechanical polishing (CMP) process wherein the polishing removes at least some of the second dielectric layer.

* * * * *